United States Patent [19]

Wang et al.

[11] 4,171,521
[45] Oct. 16, 1979

[54] CHARGE-COUPLED ANALOG-TO-DIGITAL CONVERTER

[75] Inventors: Chi-Shin Wang, San Jose; Ching-Lin Jiang, Los Angeles, both of Calif.

[73] Assignee: Hughes Aircraft Company, Los Angeles, Calif.

[21] Appl. No.: 802,835

[22] Filed: Jun. 2, 1977

[51] Int. Cl.² ............................................. H03K 13/03
[52] U.S. Cl. ...................... 340/347 AD; 307/221 D; 357/24; 340/347 M
[58] Field of Search .................. 340/347 AD, 347 M; 357/24; 307/221 C, 221 D

[56] References Cited

U.S. PATENT DOCUMENTS 3,930,255 12/1975 Means ............................ 340/347 AD
4,072,939 2/1978 Heller et al. .................. 340/347 AD Primary Examiner—Thomas J. Sloyan
Attorney, Agent, or Firm—W. H. MacAllister; Joseph E. Szabo

[57] ABSTRACT

Analog-to-digital conversion through successive approximation is implemented by means of a charge coupled device. During the conversion process two charges are compared, each comparison yielding one bit of a multi-bit number. By increasing the lesser of the compared charges after each comparison, the need to subtract charge as part of the successive approximation process is eliminated.

4 Claims, 21 Drawing Figures

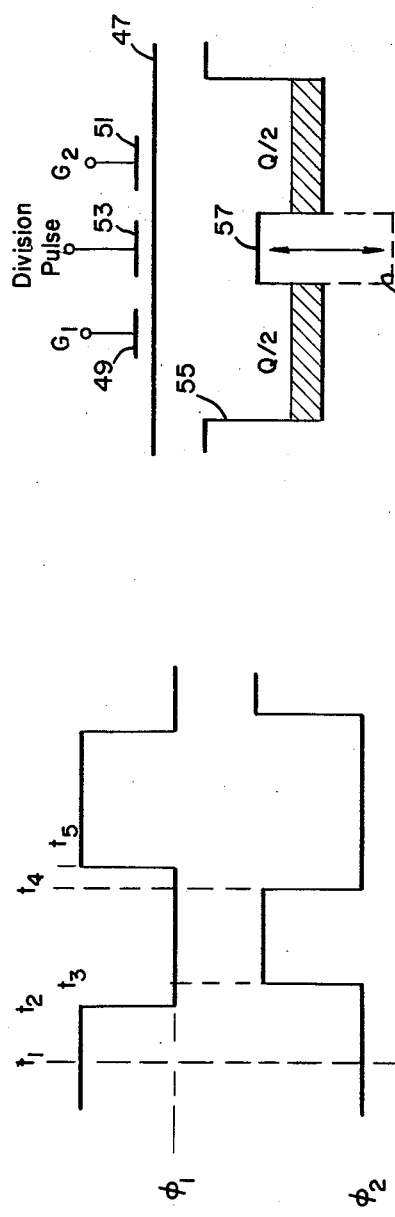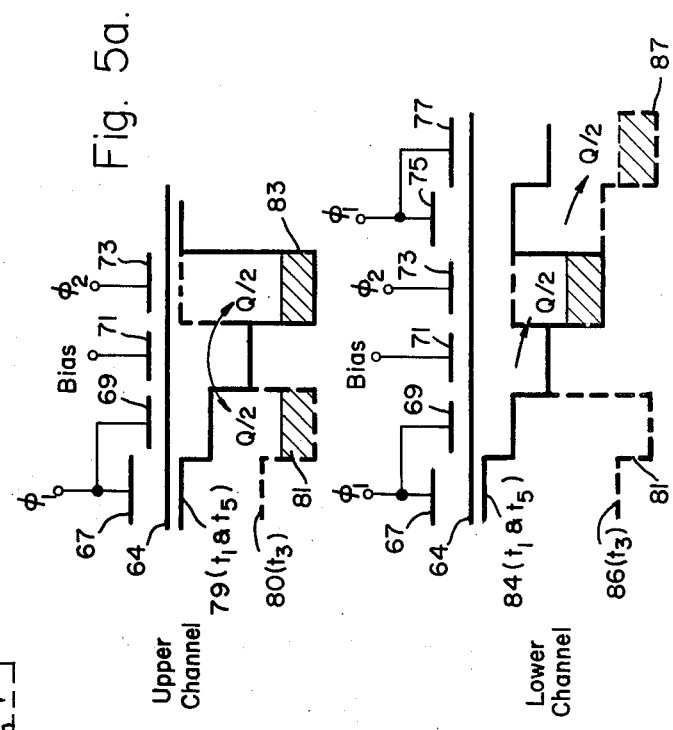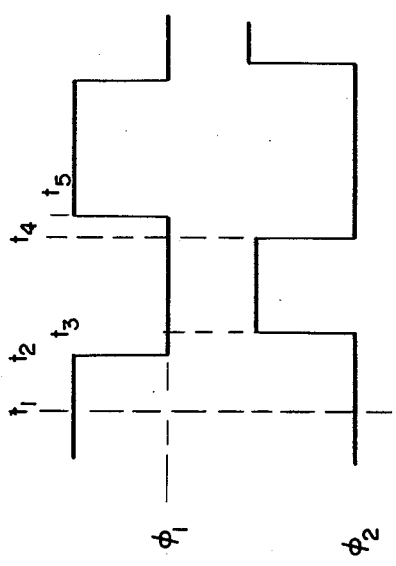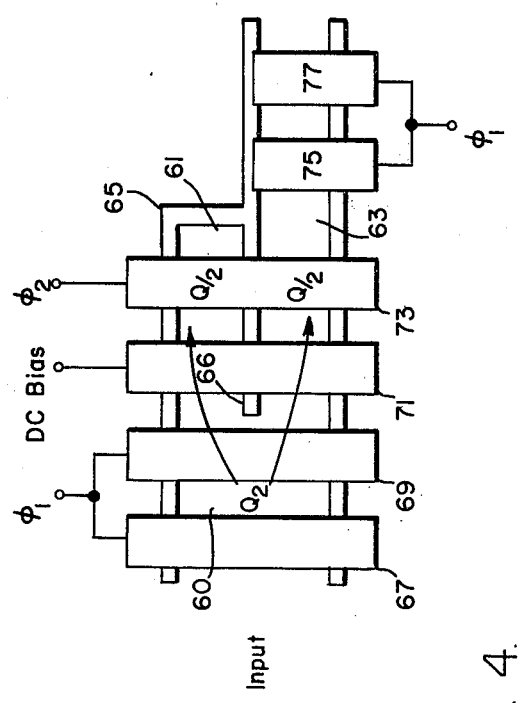

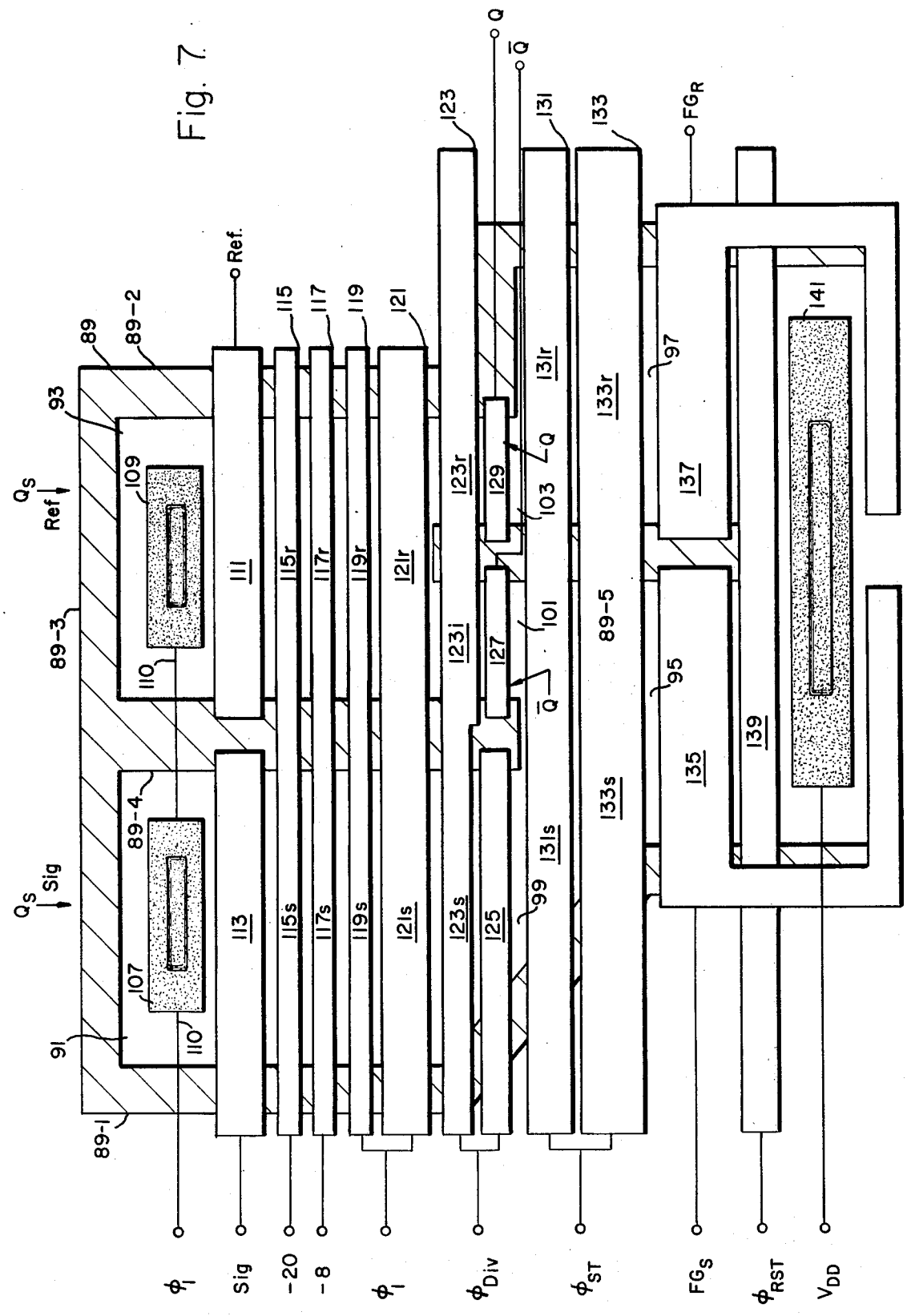

Fig. 8d.
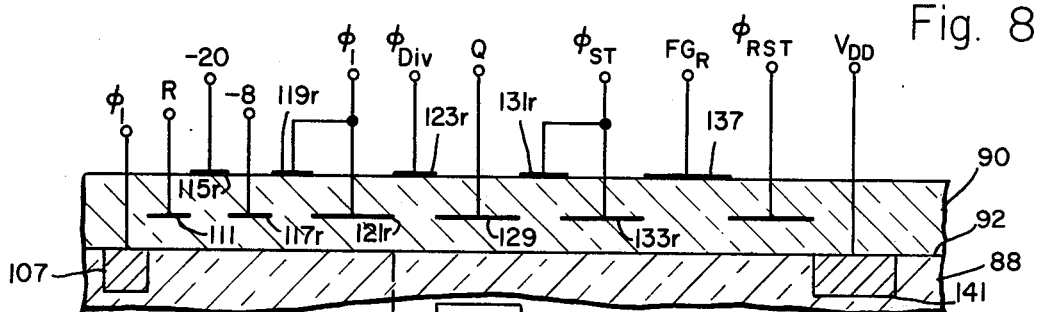
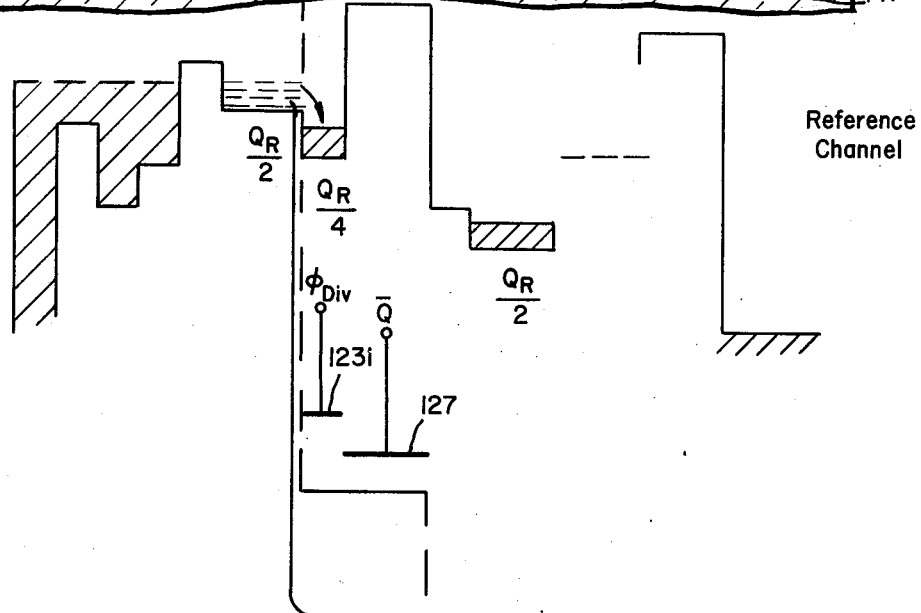
Reference Channel
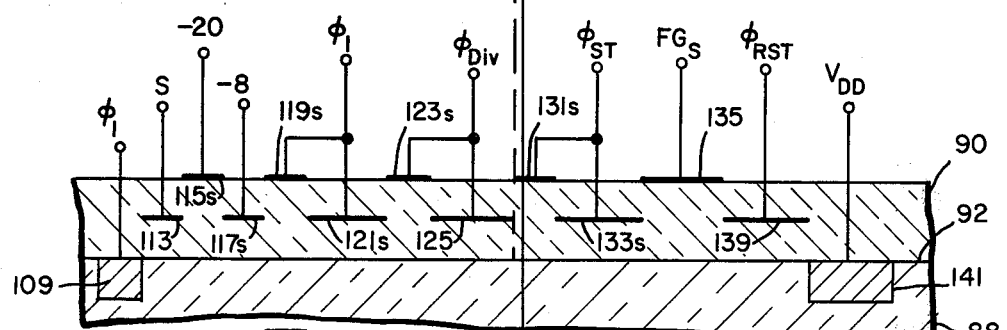
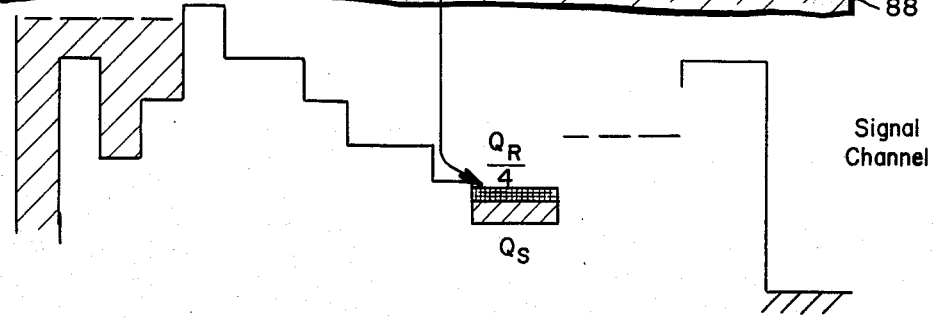
Signal Channel

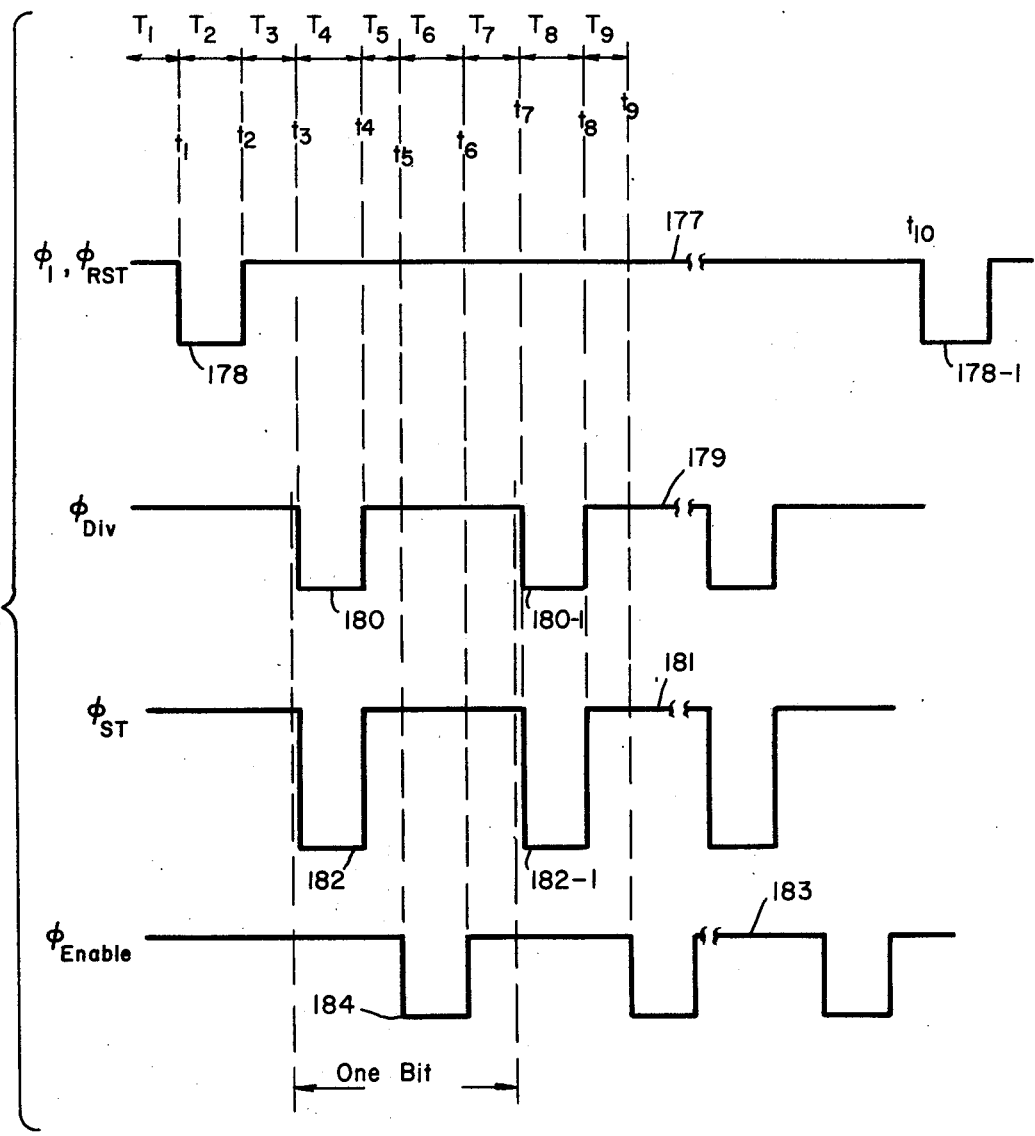
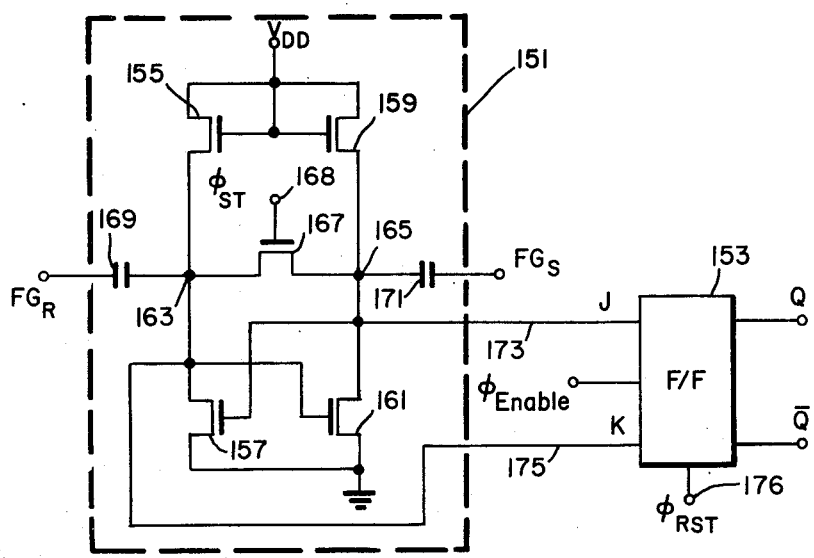
Fig. 10.
Fig. 9.

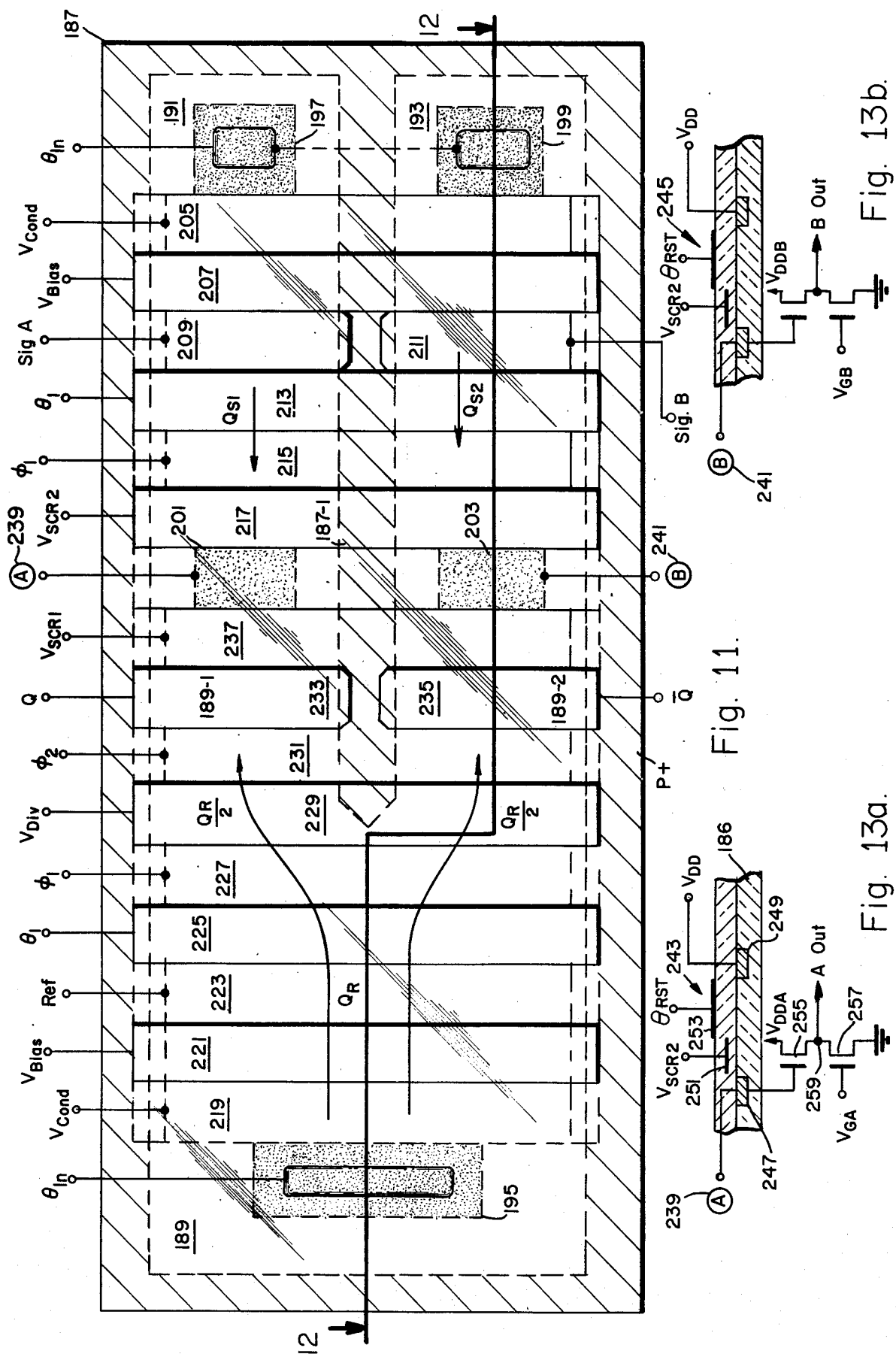

CHARGE-COUPLED ANALOG-TO-DIGITAL CONVERTER

BACKGROUND OF THE INVENTION

The present invention relates generally to analog-to-digital code converters and in particular to such code converters implemented by means of charge coupled device technology.

An analog-to-digital converter encodes an analog signal, S, as a sum of powers of $\frac{1}{2}$:

$$S \simeq \sum_{n=1}^{M} b_n \left(\frac{1}{2}\right)^{-n} \text{ (for an } M\text{-bit machine)}$$

where $b_n$'s are 1 or 0, and the full scale reference is taken to be 1.0. The conventional successive approximation algorithm for determining the $b_n$'s is to compare S with $$R_k = \sum_{n=1}^{k-1} b_n \frac{1}{2^n} + \frac{1}{2^k}$$

for the kth bit conversion. If S exceeds $R_k$, $b_k = 1$ and if S is less than $R_k$, $b_k = 0$. The k+1 reference then becomes:

$$R_{k+1} = R_k - \frac{\bar{b}_k}{2^k} + \frac{1}{2^{k+1}}$$

where a subtraction is involved. ($\bar{b}_k$, 0, 1 for $b_k = 1$, 0 respectively).

Stating the above nonmathematically, the signal S is progressively compared with $$R = \frac{1}{2}, \frac{1}{2} + \frac{1}{4}, \frac{1}{2} + \frac{1}{4} + \frac{1}{8}, \text{ etc.}$$

As soon as R exceeds S, the last added fraction ($\frac{1}{8}$) must be subtracted and the next in the series of ($1/2^n$) (e.g. 1/16) added. The approximations then continue by successively adding progressively smaller members of the series ($1/2^n$) to R until it again exceeds S, at which time the member of the series (say 1/32) which caused R to exceed S is subtracted from R and, prior to the next comparison, the next member in the series (1/64) is added to R. The process continues through a series of approximations depending in number on the desired precision of the system.

Charge subtraction is not as readily performed in charge coupled devices as is the addition of charge. The only known prior attempt to perform analog-to-digital conversion by means of a CCD device without using charge subtraction is that described in U.S. Pat. No. 3,930,255. It involves a succession of stages for performing respective ones of the successive approximations, resulting in a larger than desirable device.

It is therefore an object of the present invention to create an improved analog-to-digital converter which is particularly suitable for CCD implementation, resulting in a high speed, and highly compact, device.

A further object of the present invention is to provide a CCD analog-to-digital converter wherein charge is always added between successive approximations.

A related object of the present invention is to provide a method of analog-to-digital conversion through successive approximation which permits a signal to be successively compared with a progressively greater reference without requiring the reference to be reduced as a result of exceeding the signal.

These and other objects of the invention are attained through a method for converting an analog signal into its binary equivalent comprising the following steps:

(1) store at a reference input location in a semiconductor charge storage medium a charge proportional to a reference signal;

(2) transfer half of the charge which is at the reference input location to a reference sensing location in the charge storage medium and store at a signal sensing location in the medium a charge proportional to the analog signal;

(3) compare the charges stored at the signal sensing and reference sensing locations and register the results of the comparison;

(4) if the charge at the signal sensing location exceeds the charge at the reference sensing location, transfer half of the charge remaining at the reference input location to the signal sensing location; if not, transfer half of the charge remaining at the reference input location to the reference sensing location; and (5) repeat the last two of the above steps a predetermined number of times.

Implemented as an analog-to-digital converter, the present invention may be characterized by a combination which includes means for generating a reference charge $Q_R$ and an analog signal charge $Q_S$. During successive iterations a fractional reference charge ($Q_R/2^n$) is progressively derived by charge splitting means from the reference charge $Q_R$. First and second charge summing means are provided, the first of them receiving the charge $Q_S$. The fractional reference ($Q_R/2^n$) is entered into a selected one of the first and second charge summing means in response to a control signal which may have either a first or a second state representative of the relative magnitudes of the charges in the first and second charge summing means. This control signal is generated by a circuit which compares, and responds to, the contents of the first and second summing means. The means which respond to the control signal is operative to enter the fractional reference charge ($Q_R/2^n$) into that one of the first and second charge summing means whose stored charge is indicated to be the lesser by the control signal generating circuit.

By virtue of the invention as described briefly above, each step of the successive approximation process used to generate the binary equivalent of a signal involves the addition of a charge either to the signal or to the reference with which it is compared. Consequently, the successive approximations progress through a series of steps during which one or the other of the compared quantities is increased, this being in contrast to the conventional method of successive approximation during which only one of two compared quantities is changed, either by adding to it or subtracting from it, depending upon whether it exceeds or falls short of the signal with which it is compared.

The invention will become apparent in light of the following detailed description taken in conjunction with the accompanying drawings, wherein:

FIG. 3 is one type of charge splitter which may be used to generate a reference charge in the CCD A/D converter of FIG. 2;

FIG. 4 is a second type of charge splitter which may be used in place of that shown in FIG. 3 in the system of FIG. 2;

FIGS. 5a and 5b are schematic illustrations of the upper and lower channels of the charge splitter of FIG. 4 showing also the potential gradient prevailing in those channels;

FIG. 6 is a timing diagram of the clocking voltages used to operate the charge splitting device of FIG. 4;

FIG. 7 is a simplified plan view of a CCD A/D converter constructed to embody the basic principles illustrated in the block diagram of FIG. 2;

FIGS. 8a through 8e are a series of diagrams, each illustrating schematically, by way of cross sections through various channel regions of the converter of FIG. 7, the vertical disposition of electrodes illustrated in plan view in FIG. 7, and successively illustrating the voltage gradients and location of charges in those channels at successive instants of time referenced in FIG. 10;

FIG. 9 is a schematic diagram of the comparator and flip-flop circuits of FIG. 2;

FIG. 10 is a timing diagram of the clocking signals used to operate the A/D converter illustrated in detail in FIGS. 7, 8a–8e and 9, identifying the various instants of time for which the location of charge is identified in FIGS. 8a–8e;

FIG. 11 is a simplified plan view of a second CCD A/D converter implementing the principles illustrated in FIGS. 1 and 2;

FIGS. 13a and 13b are schematic cross sectional representations of a pair of drain circuits for removing charge from points A and B, respectively, of the CCD A/D converter illustrated in FIGS. 11 and 12.

Figure 1:
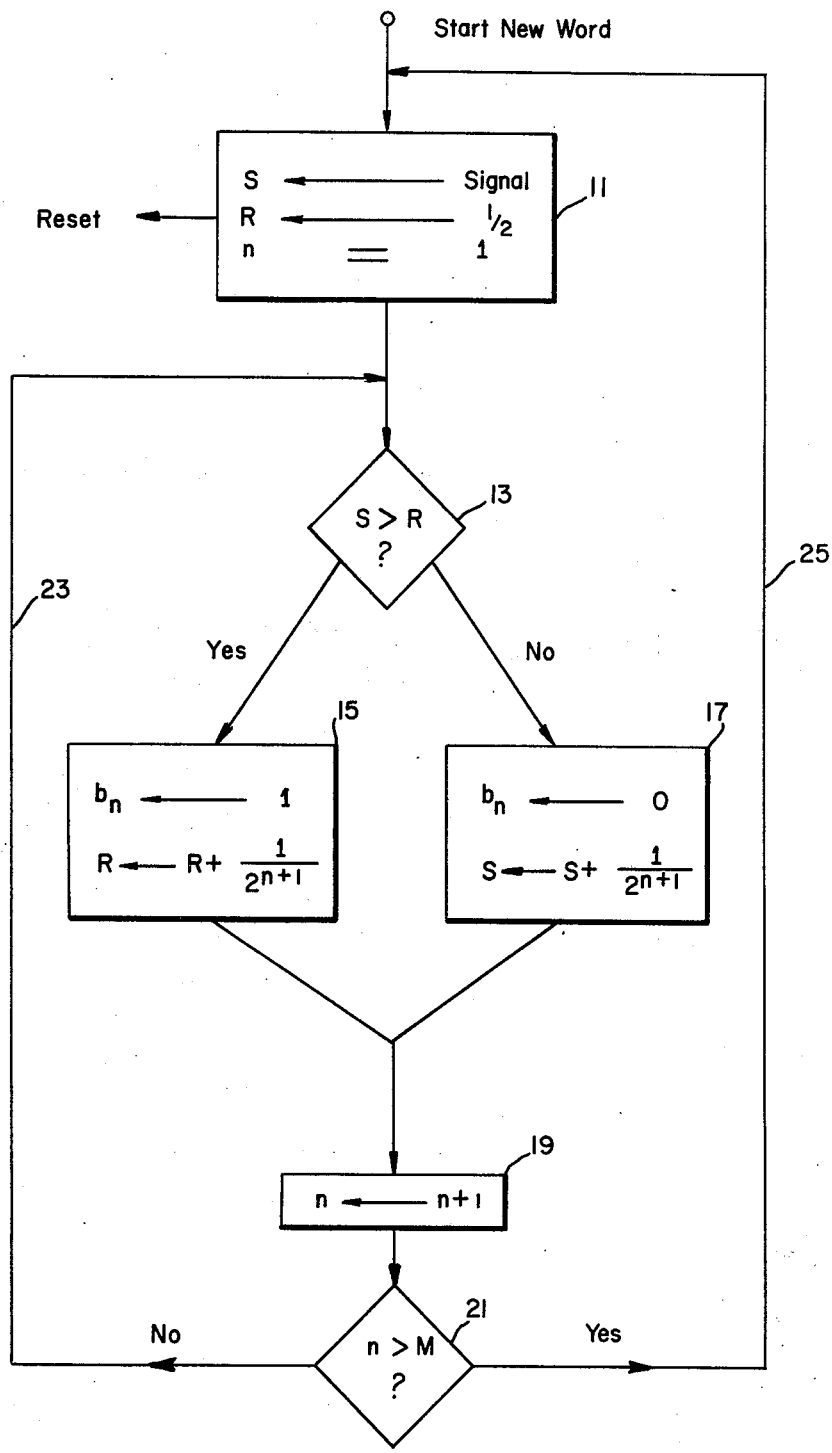
FIG. 1 is a flow chart illustrating the steps of analog-to-digital (A/D) conversion carried out in accordance with the present invention.
Figure 2:
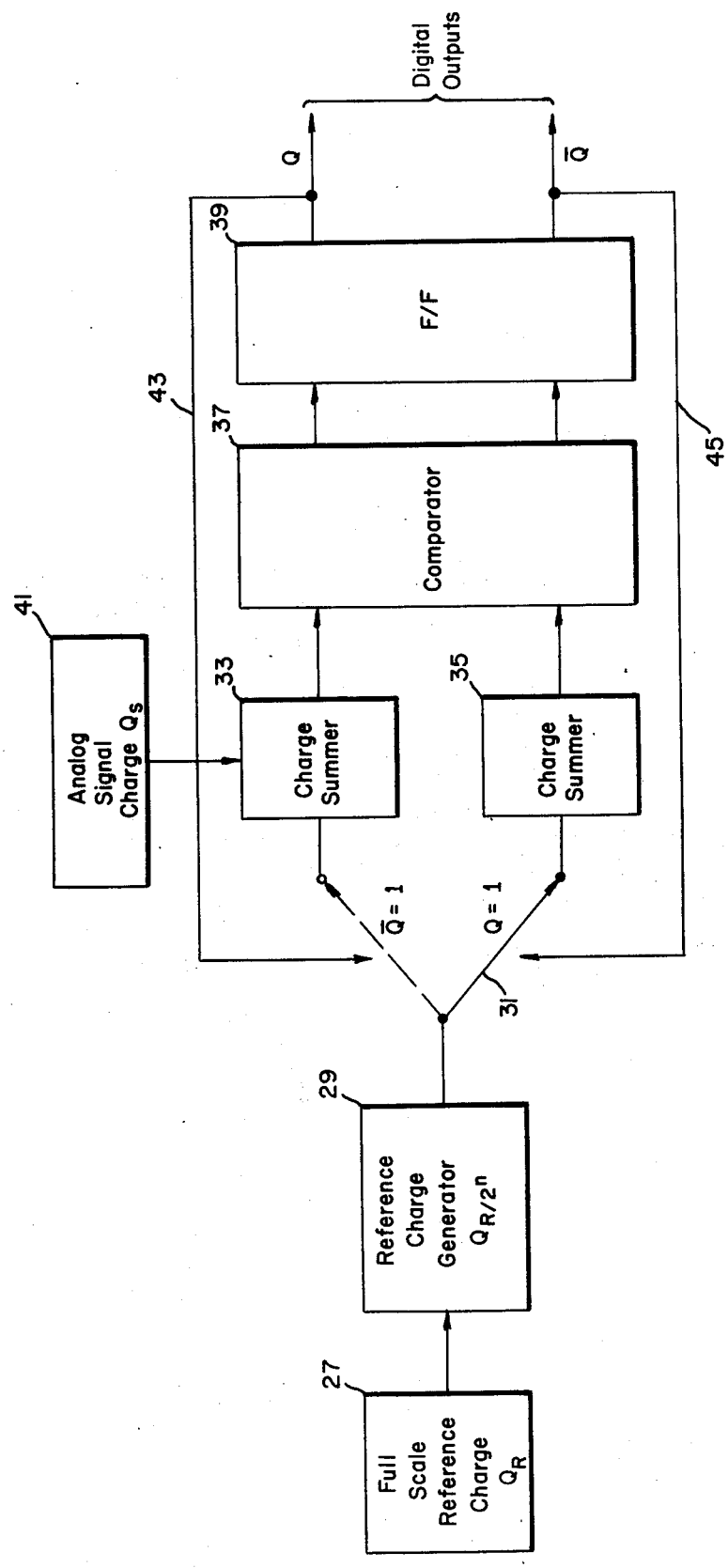
FIG. 2 is a block diagram of an A/D converter implemented by means of charge coupled device (CCD) technology.

The steps for performing A/D conversion in accordance with the present invention may be best understood by reference to FIG. 1, depicting the sequence of events which takes place during the conversion, and by also referring to FIG. 2 which is a block diagram of a system organized to carry out the steps depicted in FIG. 1. As is typical with the process of successive approximations, a signal S is converted into an n-bit binary number, often referred to as a "word." The bits of the word progress from a first or most significant bit (MSB) to the last or least significant bit (LSB). Successive bits signify, by having a one or zero value, the presence or absence of a component in the aggregate made up of the sum of the bits, each bit signifying a value which is one-half that signified by the preceding bit. Block 11 of FIG. 1, which denotes the initial portion of the process, designates three symbols S, R and n. S and R respectively represent the locations of two quantities which are to be compared, S representing the signal location and R representing a reference location. On the other hand, n denotes whether the comparison which is to take place is the first or a subsequent number in the series of comparisons which comprise the conversion process. The analog signal charge is indicated in FIG. 2 as $Q_S$, being generated in the block 41, whereas the reference is illustrated as $Q_R$, generated in the Full Scale Reference Charge block 27, whose output is applied to Reference Charge Generator 29. The latter is operative to derive from $Q_R$ successively smaller charges equal to $(Q_R/2^n)$ where n is the number of iteration being performed.

Initially then, the signal to be compared is applied to the location in the system in which comparison takes place, this being designated as S in FIG. 1 and as the charge summer 33 in FIG. 2. A reference equal to one-half is applied to a second comparison location, represented by R in FIG. 1 and by the charge summer block 35 in FIG. 2. It will be noted that in FIG. 2 output of the reference charge generator, $(Q_R/2^n)$ may be applied either to the charge summer 33 or to the charge summer 35 depending upon the location of a two position switch 31. As part of the initial step in carrying out the conversion in accordance with the present invention, the switch 31 is placed so as to apply the output of the Reference Charge Generator 29 to the charge summer 35 and it is for that reason that during that initial step, designated by block 11 of FIG. 1, one-half of the initial reference is applied to the reference comparison location R. The comparison is indicated by FIG. 1 block 13 and is performed by comparator 37 of FIG. 2. If the signal in S exceeds that in R (hereinafter: "if S exceeds R"), the steps of FIG. 1, block 15, are carried out; if not, those of block 17 take place. Thus, if S exceeds R, a signal is generated, indicating that the bit for that particular iteration has a value of 1. The means for signalling this in FIG. 2 is the flip-flop 39. A second effect of finding that S exceeds R during the comparison step 13 is that in the location for the reference quantity, that quantity is increased by an amount equal to $(1/2^{n+1})$. Thus, in the system of FIG. 2 the fact that S exceeds R is manifested by a logic 1 signal on the Q output terminal of the flip-flop 39 which is fed back over the line 43 to cause the path from the Reference Charge Generator 29 to be opened to the charge summer 35, wherein the reference charge quantity resides.

Alternatively, if S does not exceed R, that fact too is registered by the flip-flop 39 and signalled by a logic 1 signal on its $\overline{Q}$ output. Additionally, the presence of a logic 1 on the $\overline{Q}$ output of the flip-flop 39 is fed back over line 45 to the switch 31, causing it to open a path from the Reference Charge generator 29 to the charge summer 33 so that the charge $(Q_R/2^n)$ is added to the signal stored in the charge summer 33. In terms of the nomenclature employed in FIG. 1 this is represented by adding the quantity $(1/2^{n+1})$ to the signal quantity residing in the signal sensing location.

The number of the iteration which is to take place next is indicated as being one greater than that which has just taken place. Shown as the step 19 in FIG. 1, this can be achieved by means not shown in FIG. 2, such as a simple counter connected to one or both of the outputs Q and $\overline{Q}$ of the flip-flop 39. Also, by means not shown in FIG. 2, the output of the counter representing the number of the iteration is compared as shown in block 21 of FIG. 1 with a number M representing the desired number of iterations, i.e., desired number of bits in the word representative of the signal which is to be converted into digital form. If n exceeds M, the conversion process is complete and this fact is fed back over the line 25 to command that the steps be performed on the next signal which is to be converted. If n does not exceed M, there is at least one more iteration to be performed and this fact is fed back over the line 23 to the input of the step represented by the block 13, causing the signals which have been placed at the comparison or sensing locations S and R again to be compared. The sequence of steps, 13, 15, 17, 19 and 21 is repeated until n exceeds M. In the system of FIG. 2, after each iteration the status of the bistable flip-flop 39 may remain the same or may change. The state of the flip-flop represents both the output of the system after each iteration and the means which determines the position of the switch 31 prior to the comparison associated with the next iteration of the system.

Two alternative embodiments, both of them charge coupled devices for repeatedly splitting in half a quantity of charge, are illustrated in FIGS. 3 and 4. Either of them could perform the function of the Reference Charge Generator 29. The first embodiment of FIG. 3 comprises three electrodes 49, 51 and 53 over the surface 47 of a semiconducting storage medium, commonly referred to as a substrate. The resulting structure would typically form part of a CCD register. The electrodes 41 and 51 would typically be maintained at reference pontetials $G_1$ and $G_2$ so as to create a potential well 55. A devision pulse is applied to the electrode 53 between the two electrodes 49 and 51 so as to alternately establish a potential gradient level 57 and 59 which are respectively above and below the potential level maintained by the electrodes 49 and 51. By means not shown, a charge would be transferred into the potential well 55 prior to or during the time when the potential level under the central gate 53 is at its lower level 59. Thereafter, the potential gradient under that gate would be raised to its upper limit 57, causing the charge to be split into two equal halves (Q/2) on either side of the substrate underlying the dividing gate 53. By means also not shown, either one of the resulting halves of the originally stored charge could then be shifted out from the potential well 55. The potential under the dividing gate 53 would then again be returned to its lower level 59, causing the remaining half charge (Q/2) to be distributed over the entire potential well 55. Each subsequent time that the potential level on the divider gate 53 is raised to its upper level 57, the charge would be split in half.

The second embodiment illustrated in FIG. 4 is that which is preferred for use with the present invention.

As illustrated in FIGS. 4, 5a and 5b, the preferred charge divider is charge coupled device formed in a semiconducting substrate, typically P doped silicon, having a series of electrodes disposed over its surface 64. Defined in the substrate is an input channel 60 which opens into a pair of adjacent channels 61 and 63. All of the channels are formed in the substrate by means of channel stopping regions 65 which are highly doped to form a barrier to the passage of charge along the surface of the substrate. A first pair of electrodes 67 and 69 extends over the input channel 60. A second pair of electrodes 71 and 73 extends over both of the channels 61 and 63, and a third pair of electrodes 75 and 77 extends over the lower channel 63.

The upper channel 61 has no individual electrode serving it, because it is closed off at its downstream (right) end, whereas the lower channel 63 is open at that end. The electrodes 67, 69, 75 and 77 receive a first clocking voltage $\phi_1$, the electrode 73 receives a second clocking voltage $\phi_2$, and the electrode 71 is DC biased. Progressive splitting of a quantity of charge during successive cycles of operation of the device illustrated in FIGS. 4, 5a and 5b will be readily understood by referring to those figures in combination with FIG. 6, depicting the timing of the clocking voltages $\phi_1$ and $\phi_2$.

At the instant $t_1$ the $\phi_1$ and $\phi_2$ clock voltages are respectively high and low, causing them to create potential gradients in the substrate as illustrated by the solid line 79 and 84 in FIGS. 5a and 5b. Just immediately prior to this instant, a charge had resided under the electrode 69, distributed evenly along its length. Consequently, at the time $t_1$ this charge will move down along the potential gradients 79 and 84 into the potential well 81 under the electrode 73 spanning the closed and open channels 61 and 63. Since the center divider portion 66 of the channel stopper 65 creates two equal sized outlets from the input channel 60 into the channels 61 and 63, the charge Q previously residing under the electrode 69 will be split in two, each channel 61 and 63 receiving one-half, or (Q/2).

At the instant $t_2$ the clock voltage $\phi_1$ drops, causing the charge (Q/2) previously residing under the electrode 73 in the open channel 63 to be shifted to a new potential well 87 created under the electrode 77. The corresponding change in the potential gradient in the closed channel 61 does not affect the location of the charge (Q/2) which will therefore remain in the potential well 83. A short time later at time $t_3$ the voltage $\phi_2$ rises, forcing the charge (Q/2) previously in the potential well 83 under the electrode 73 in the closed channel 61 to flow back out of that potential well and into the potential well 81 under the electrode 69 in the input channel 60. The potential gradients brought about at the instant $t_3$ are depicted by the dashed lines 80 and 86 in FIGS. 5a and 5b. At time $t_4$, with the clocking voltage $\phi_1$ still low, the clocking $\phi_2$ now drops also. With both of the clocking voltages low, the charge (Q/2) remains under the electrode 69 in the potential well 81, the other potential well 83 existing at that time in the closed channel 61 being empty at this time. Similarly empty is the potential well 87 under the electrode 77 in the open channel. This is the condition preceding the splitting of charge which was mentioned at the beginning of this description.

Then, at the time $t_5$ the same set of conditions which were shown to exist at the time $t_1$ reoccur and the potential gradients depicted by the solid lines 79 and 84 in FIGS. 5a and 5b are reestablished. As a result, the charge (Q/2) residing under the electrode 69 in the potential well 81 is shifted downstream past either side of the channel stopper divider portion 66 and into the potential wells 83 and 87, where the charge (Q/2) is stored temporarily in two equal halves (Q/4).

As the above described sequence is repeated through the time periods $t_1$–$t_4$, with each repetition of the cycle the charge shifted under the electrode 77 is half its previous amount. The essential characteristic of the device is seen to be the "sloshing" of charge back and forth between the input channel 60 and the closed channel 61 so that each time that the charge is sloshed forward, it is split into two halves by the action of the channel stopper divider portion 66, only one-half of the charge reaching the output portion of the open channel 63.

Figure 8A:
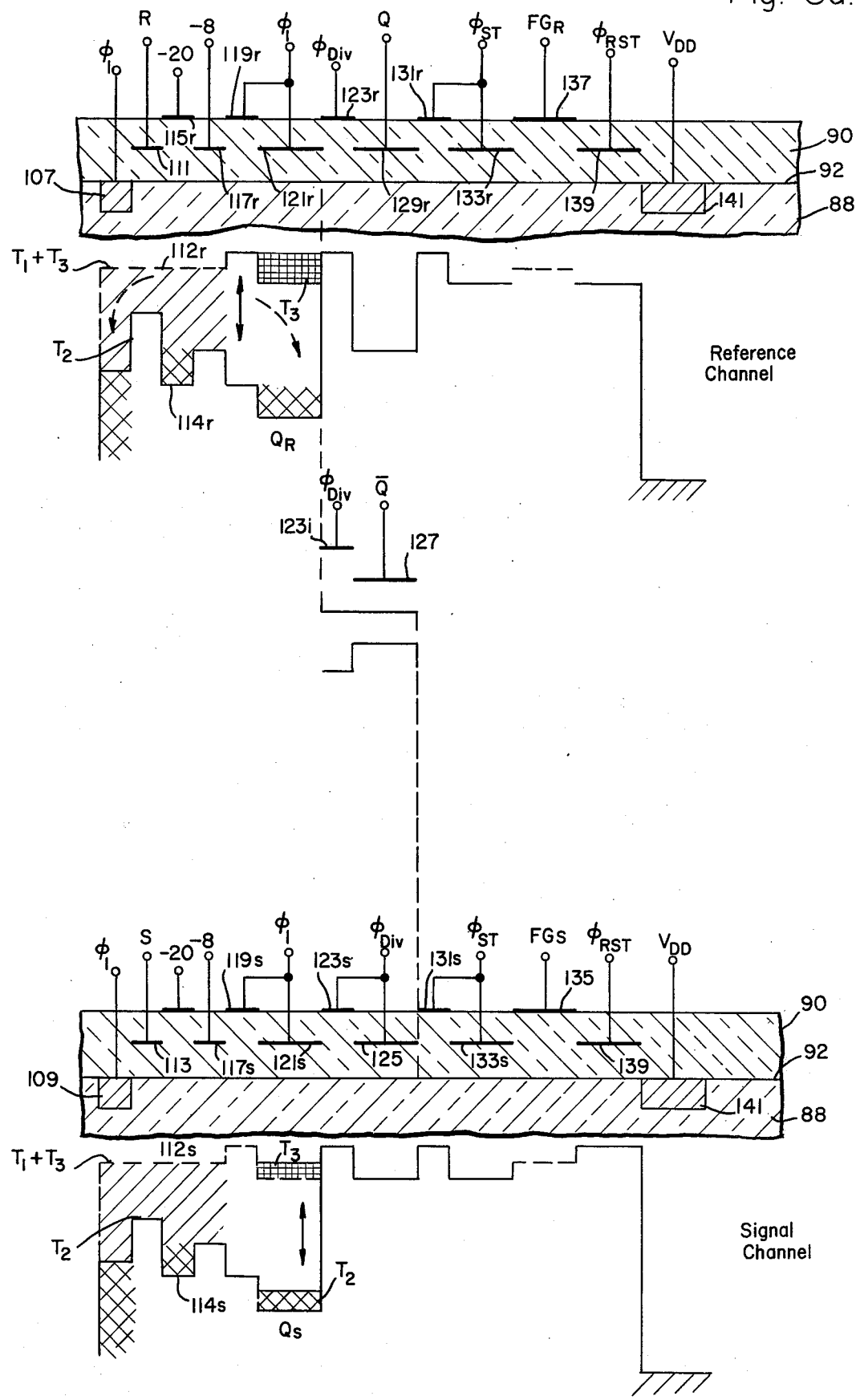

A preferred embodiment of a CCD A/D converter operating in accordance with the principles outlined with reference to FIGS. 1 and 2 and utilizing a charge splitter similar to that described with reference to FIGS. 4–6 is illustrated in plan view in FIG. 7 and in a cross section in FIGS. 8a–8e. Referring in particular to FIG. 7 and FIGS. 8a and 9, the exemplary CCD A/D converter is formed in a semiconductor charge storage medium 88, shown as having n-type conductivity, with an insulating layer 90 covering at least one surface 92 of the medium. Means 89, typically one or more channel stopping regions which form a barrier to the flow of charge, shown formed by P+ diffusion, defines in the charge storage medium a signal input channel 91, a reference input channel 93, a signal sensing channel 95 and a reference sensing channel 97, with the signal input channel 91 opening through an inlet 99 into the signal sensing channel 95 and with the reference input channel 93 opening into both the signal sensing and reference sensing channels 95 and 97 through two inlets 101 and 103 of equal size.

A plurality of electrodes 111–133 and 139 are supported by the insulating layer 90 over the channels 91, 93, 95 and 97 and receive control voltages (shown as $\phi_1$, −20, −8, $\phi_{DIV}$, $\phi_{ST}$, and $\phi_{RST}$) from appropriate sources (not shown) in order to control the disposition of charges in the aforementioned four channels. Input means including certain (111, 113, 115, 117, 119, 121) of the plurality of electrodes just listed, as well as a pair of input diffusions 107 and 109, are provided for individually injecting and storing in respective ones of the signal and reference input channels 91 and 93 signal and reference charges $Q_S$ and $Q_R$. Further means, including certain (123, 125, 131 and 135) of the aforementioned plurality of electrodes and the means for applying the appropriate control voltages to them, serve to shift the signal charge $Q_S$ from the signal channel 91 to the signal sensing channel 95 and to hold the charge $Q_S$ in the latter channel.

During each of a series of periodically recurring time periods, half of the charge stored in the reference input channel 93 is shifted into a selected one of the signal and reference sensing channels 95 and 97 by dividing means which includes certain (123, 127, 129, 131 and 133) of the noted plurality of electrodes and their associated control voltage generating means. In order to sense the relative magnitudes of the charges thus stored in the signal sensing and reference sensing channels 95 and 97, means, including a pair of additional electrodes 135 and 137, are supported over the charge storage medium 88 by the insulating layer 90. Coupled between the sensing means 135 and 137 and selected ones (127 and 129) of the electrodes forming the dividing means are control means 151 and 153 (FIG. 9) operative to cause the dividing means (123, 127, 129, 131 and 133) to shift charge to a selected one of the signal and reference sensing channels 95 and 97 in response to the relative charge magnitudes sensed by the sensing means 135 and 137.

As will be explained in greater detail hereinafter, in accordance with the illustrated exemplary embodiment of the invention, the control means 151, 153 of FIG. 9 are operative to apply potentials to the electrodes 127 and 129 of the dividing means which overlie the channel inlets 101 and 103, these potentials being selected to block the flow of charge through a selected one of the inlets, while causing charge to flow through the other.

The illustrated exemplary embodiment is further characterized by the fact that the control means 151, 153 is operative first to create a potential well under that one of the electrodes 127 and 129 which extends over the blocked one of the inlets 101 and 103 so as to cause half of the charge in the reference channel to be captured in that potential well while permitting the other half of that charge to flow through the unobstructed one of the inlets, the same control means being subsequently operative to create a potential gradient causing the captured half of the charge to return to the reference channel 93 for subsequent use. This general method of operation will be recognized to incorporate the principle of sloshing charge back and forth for successive division thereof which was explained with reference to FIGS. 4–6.

The charges in the sensing registers 95 and 97 are compared during each of a succession of similar steps, each for generating one bit of a multi-bit number, as explained with reference to FIGS. 1 and 2. After a predetermined number of such comparisons the charges are purged from both channels by means of a drain 141 which, like the input junctions 107 and 109, will typically be formed by means of a P+ diffusion in the n-type substrate 88. By applying a clocking voltage $\phi_{RST}$ to the gating electrode 139 the charges are prevented from reaching the drain 141 until the process of successive approximations has been completed.

A residual charge will remain in the reference channel. However, since its magnitude is much less than half of the least significant bit of the conversion process, its effect on the converter performance is insignificant.

Figure 8B:
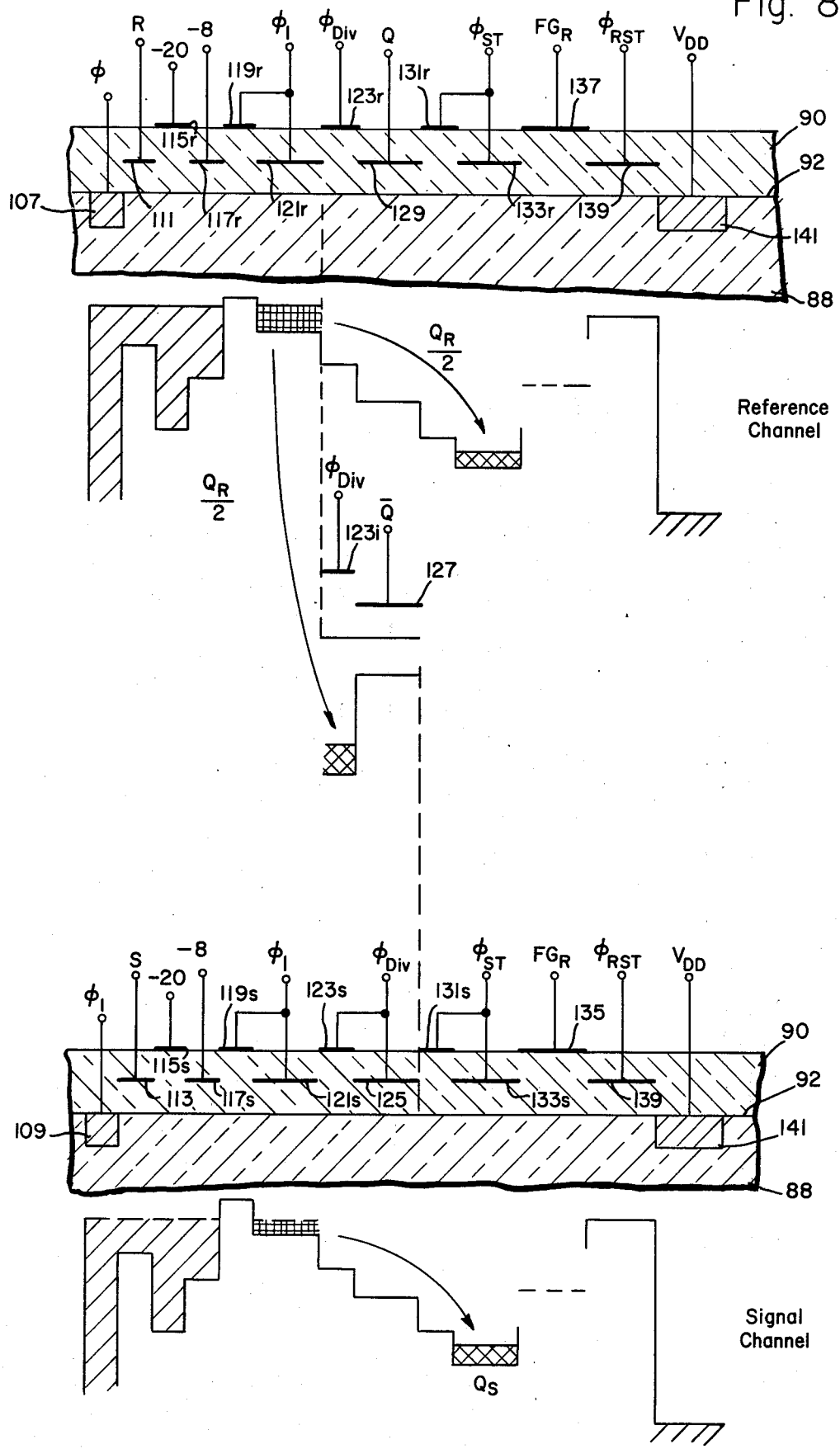
Figure 8C:
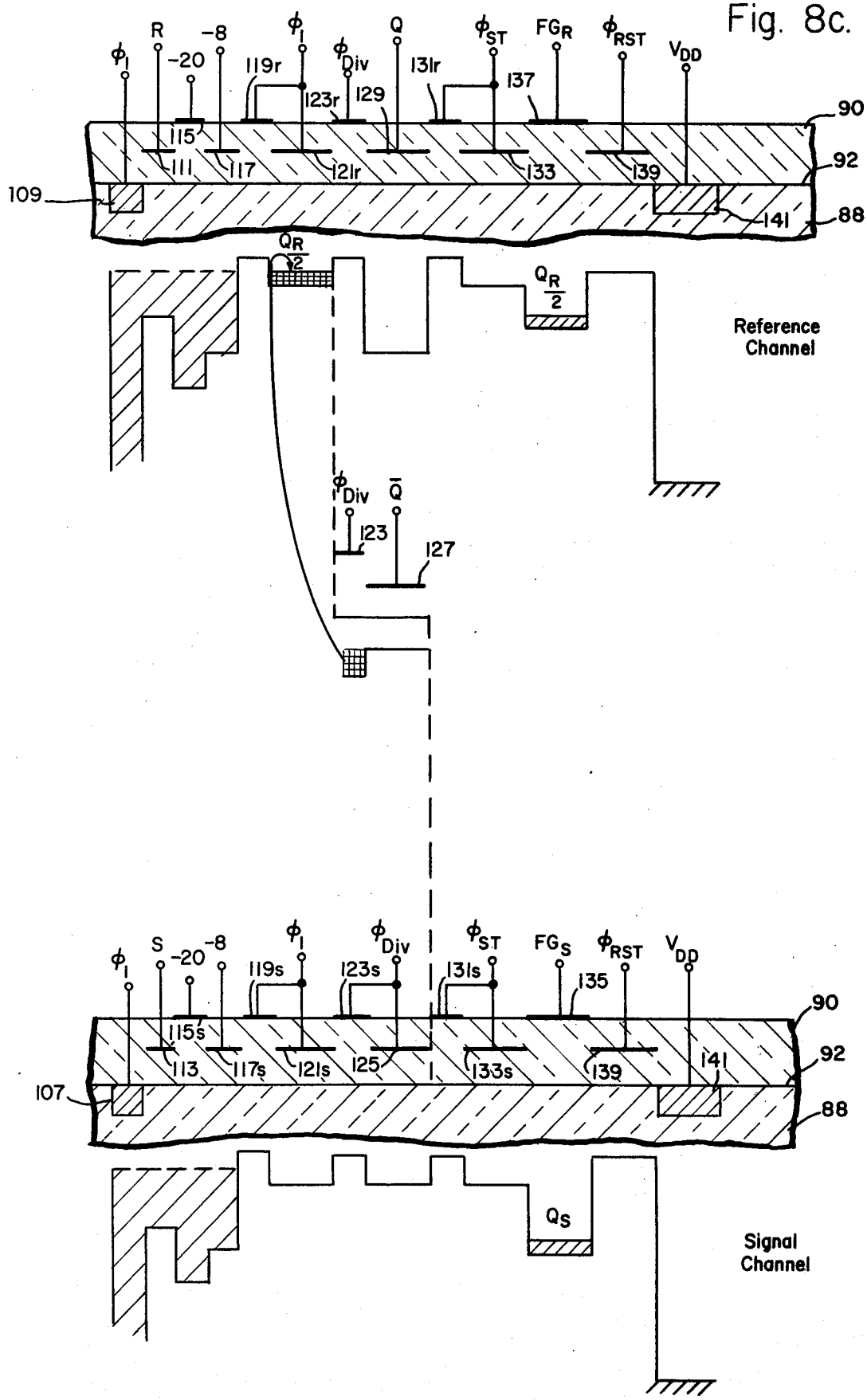
Figure 8E:
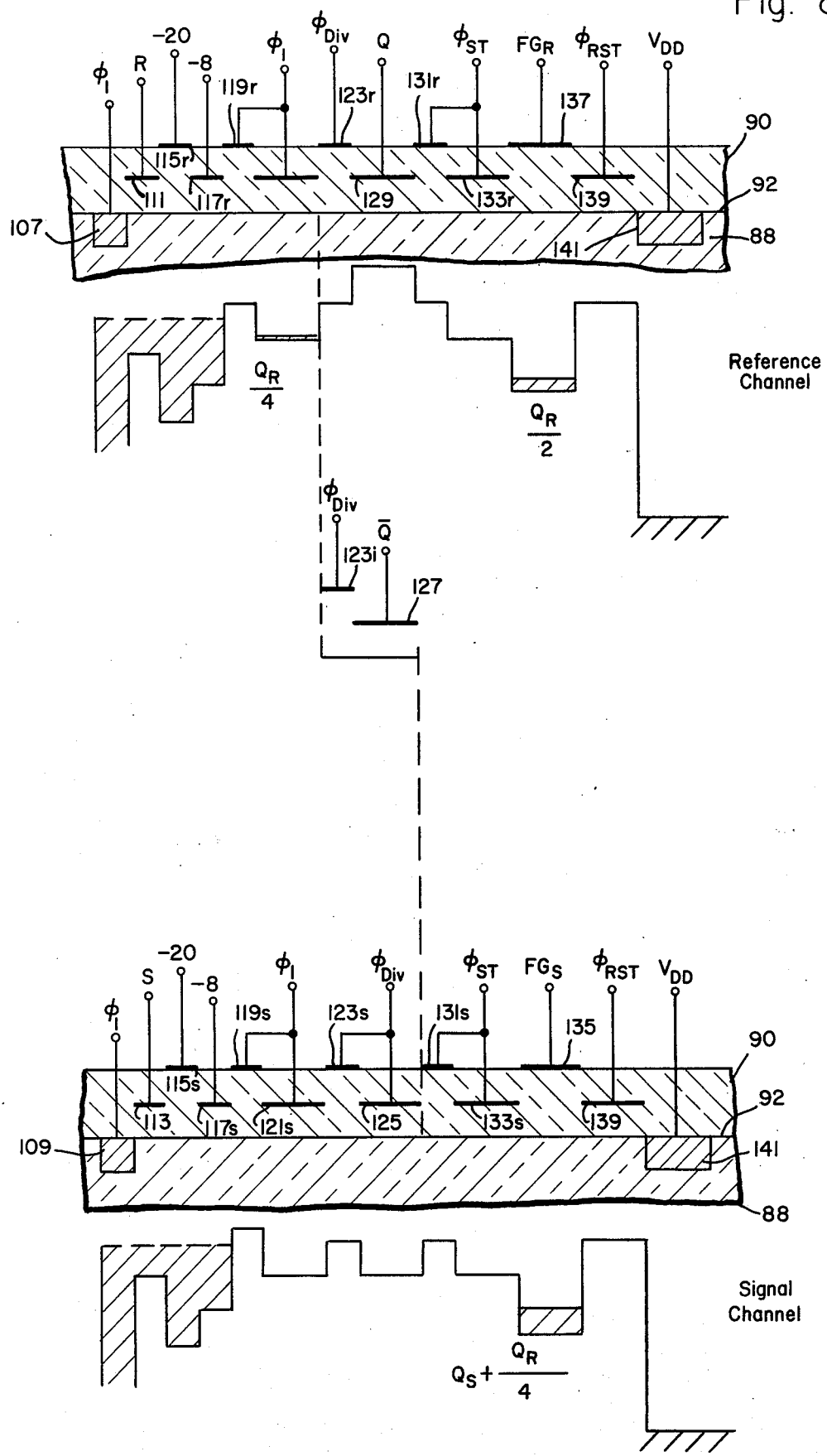

Reference will next be made to FIGS. 8a–8e and FIG. 10 together with FIG. 7 for a more detailed explanation of the manner in which the system just described operates. The initial conditions for setting up a particular conversion are shown in FIG. 8a which shows the potential levels in the system during time periods $T_1$, $T_2$ and $T_3$ identified in FIG. 10. Each of the four waveforms 177, 179, 181 and 183 in FIG. 10 which represents the five clocking voltages applied to the system of FIGS. 7 and 8a and 8e is shown to vary between two levels. With an N-type substrate as illustrated in FIGS. 8a–8e the upper level will be taken to represent a more negative voltage. For ready reference electrodes which span both a signal channel and a reference channel will bear the suffixes s and r to identify their portions extending over the respective channels. Although only portions of electrodes, they will be referred to as electrodes rather than electrode "portions" for sake of brevity.

The conversion of an analog signal begins with a $\phi_1$ and $\phi_{RST}$ pulse 178 at the instant $t_1$. Basically, the potentials under the electrodes 111, 115r, 117r, 119r and 121r in the reference channel 91 fluctuate between an upper level 112s and a lower level 114s under the influence of the clocking voltage $\phi_1$.

Prior to the leading edge of the $\phi_1$ pulse 178, the potential levels in the reference and signal channels 93 and 91 are at the levels 112r and 112s. Beginning with the instant $t_1$ and during the entire period $T_2$, the potentials in the aforesaid channel regions drop to the level 114r and 114s. As a result, a reference charge $Q_R$ overflows into the potential well under the electrode 121r and a signal charge $Q_S$ overflows into the potential well under the electrode 121s. In each instance the charge thus collected under the respective potential wells will be proportional to the magnitude of the voltage on the input electrodes 111 and 113, respectively.

Occurring at the same time as the $\phi_1$ pulse, the $\phi_{RST}$ pulse resets the flip-flop 153, causing a logic "1" to appear at its Q output and a logic "0" at its $\overline{Q}$ output. As a result, the potential on the reference inlet gating electrode 129 undergoes a negative excursion, causing the potential gradient under that electrode to assume the lower of its two levels. Correspondingly, the other reference inlet gating electrode 127 which is connected to the $\overline{Q}$ output of the flip-flop 153 is raised to a more positive potential, causing the potential level under it to rise as shown in FIG. 8a.

Beginning at the instant $t_2$, and for the duration of the time period $T_3$, the potential levels in the noted portions of the reference and signal channels 93 and 91 return to their previous levels 112r and 112, respectively. Although the charges which had been previously deposited under the electrodes 121r and 121s are now at a higher potential level, their amounts remain the same.

At the instant $t_3$ the clocking voltages $\phi_{DIV}$ and $\phi_{ST}$ go low, establishing the potential gradients illustrated in FIG. 8b. Thus, it will be noted that the potential levels under the electrodes 121r, 123r, 129, 131r and 133r over the reference channel 93 will drop so as to create a stair-step gradient whose potential minimum is under the electrode 133r. A similar stairstep gradient is established under the electrodes 121s, 123s, 125, 131s and 133s which overlie the signal input channel 91 and the signal sensing channel 99, with its potential minimum being under the electrode 133s. Since the channel stopper region 89-5 which is midway between the channel stopper regions 89-4 and 89-2 creates two inlets 101 and 103 of equal size, one-half of the charge $Q_R$, which had resided under the electrode 121r, will move along the potential gradient to the potential well under the electrode 133r. The other half of the reference charge $Q_R$ will move through the inlet 101 into a potential well established under the electrode 123i. This half of the original charge $Q_R$ is prevented from moving beyond the inlet 101 by the potential barrier created through the reference inlet electrode 127 by the voltage on the $\overline{Q}$ output of the flip-flop 153 which, it will be recalled, is the opposite of that on the Q output of the flip-flop 153 applied to the other reference inlet electrode 129.

At the same time that the $Q_R$ charge has been transferred out of the reference input channel 93, the signal charge $Q_S$ is transferred out of that channel to the potential well under the electrode 133s.

The end of the $\phi_{DIV}$ and $\phi_{ST}$ pulses 180 and 182, occurring at the instant $t_4$, marks the beginning of the time period $T_5$. During this time period the potential levels are those depicted in FIG. 8c. Thus, return of the $\phi_{ST}$ voltage to its upper level transfers the potential well, and the ($Q_R/2$) in it, from under the electrode 133r to under the reference sensing electrode 137. The same voltage level change also causes the potential minimum and charge $Q_S$ to be shifted from under the electrode 133s to under the signal sensing electrode 135. Finally, as a consequence of the change in the level of the $\phi_{DIV}$ signal, the potential minimum previously under the electrode 123r is raised above the level of the potential well under the electrode 121r. As a result, the charge ($Q_R/2$) is transferred back into the latter potential well.

The magnitudes of the charges residing in the reference and signal sensing channels 97 and 95 are detected by the floating gate electrodes 137 and 135. These electrodes are connected to the inputs of the control circuit illustrated schematically in FIG. 9, which will now be described in detail.

The principle components of the control circuit are a comparator latch 151 and a JK flip-flop 153. The purpose of the comparator latch is to sense the two voltages assumed by the floating electrodes 135 and 137 which by themselves are not sufficient to actuate the JK flip-flop 153. The comparator 151 is comprised of two pairs of series connected MOSFETS 155, 157, and 159, 161. The reference channel floating electrode 137 is connected through a coupling capacitor 169 to the node 163 connecting the source of MOSFET 155 to the drain of MOSFET 157. The signal channel floating electrode 135 is similarly connected through a coupling capacitor 171 to the node 165 coupling the MOSFETS 159 and 161 source to drain. Connected between the nodes 163 and 165 is a fifth MOSFET 167 whose gate receives the clocking voltage $\phi_{ST}$. The gates and drains of the upper two MOSFETS 155 and 159, which serve as load resistors, are all connected to a single point which receives the reference potential $V_{DD}$. The gates of the lower two MOSFETS 157 and 161 are respectively connected to the nodes 165 and 163, so that turning on one of the transistors 157 and 161 results in turning off the other of those two transistors, both of whose sources are connected to ground. The nodes 163 and 165 serves as the outputs of the comparator latch 151 and are respectively connected to the K and J inputs of the JK flip-flop 153. That flip-flop is further controlled by a $\phi_{enable}$ and $\phi_{RST}$ control voltage whose timing is shown in FIG. 10.

An initial measuring condition is established in the comparator latch 151 by applying a $\phi_{SET}$ pulse 182 to the gate of the MOSFET 167 through its input terminal 168, turning it on. This pulls both of the nodes 163 and 165 to a common reference level, since they are both connected to one another through a MOSFET 167. At the instant when the $\phi_{SET}$ pulse terminates, the nodes 163 and 165 are isolated from one another but are at a common potential so that the sensing electrodes 135 and 137 will charge the two coupling capacitors 169 and 171 relative to the same reference potential. As the charging process continues, the nodes 163 and 165 will assume different potential levels and this difference will cause one or the other of the bottom MOSFETS 157 and 161 to turn on.

Assume, for example, that the transistor connected to node 163 is turned on. This will pull that node to ground and will cause the other transistor 161, whose gate is connected to the node 163, to be turned off. Assume further that the charge on the reference sensing electrode 137 is greater than that on the signal sensing electrode 135. This will cause the voltage on node 163 to be more positive and to cause the transistor 161 whose gate is connected to that node to become slightly turned off. This in turn will drop the voltage of the node 165 toward the negative level of $V_{DD}$ and this will rapidly turn on the transistor 157 whose gate is connected to the node 165. Thus, the latch will assume the condition in which node 163 is pulled to ground and node 165 is pulled all the way to $V_{DD}$. All of this will take place before the leading edge of the $\phi_{enable}$ pulse 184, which occurs at the instant $t_5$ and lasts for the duration of the time period $T_6$. The $\phi_{enable}$ pulse 184 permits the flip-flop 153 to respond to the levels brought about at the nodes 163 and 165 and applied over the lines 173 and 175 to the J and K inputs of the flip-flop. At a subsequent instant in time $t_{10}$, which will not occur until the end of the conversion of a signal to its digital equivalent, a $\phi_{RST}$ pulse will again be applied to the $\phi_{RST}$ terminal 176 of the flip-flop 153, causing its Q and $\overline{Q}$ outputs to be reset so that a logic "1" and logic "0" signal appear on them, respectively.

Beginning at the instant $t_5$, the $\phi_{enable}$ pulse 184 permits the flip-flop 153 to react to the inputs on its J and K terminals from the comparator latch 151. Depending upon the relative magnitudes of the voltage imposed on the floating electrodes 135 and 137, the voltages on the Q and $\overline{Q}$ outputs of the flip-flop 153 may remain the same or may change. If the signal charge $Q_S$ is greater than the reference charge ($Q_R/2$) the flip-flop 153 will reverse its states, causing a logic "0" to appear on its Q output and a logic "1" to appear on its $\overline{Q}$ output which, it will be recalled, was the starting condition of the system. If the opposite is true, and $Q_S$ does not exceed ($Q_R/2$) or whatever reference charge resides under the reference charge sensing electrode 137, the flip-flop 153 will be caused to assume that one of its two states in which a logic "1" appears on its $\overline{Q}$ output and a logic "0" on its Q output.

In the example illustrated in FIGS. 8a–8e, it is assumed that $Q_S$ does not exceed ($Q_R/2$). Therefore, the state of the flip-flop 153 will be reversed at time $t_5$, causing the potential on the reference inlet gating electrode 129 to go from low to high and the potential on the other reference inlet gating electrode 127 to go from high to low. Consequently, beginning at the instant $t_7$, (see FIG. 8d) when the next pair of $Q_{DIV}$ and $Q_{ST}$ pulses 180-1 and 182-1, respectively, begin, half of the reference ($Q_R/2$) under the electrode 121r will flow to the substrate surface underlying the electrode 123r and will be captured there by the high potential on the reference inlet gating electrode 129. The other half of the charge ($Q_R/2$) will be permitted by the other reference inlet gating electrode 127, which is now at a relatively low potential, to flow through the inlet 101 and to be added to the charge $Q_S$ which, in the meantime, has been returned from under the sensing electrode 135 to the substrate surface underlying the electrode 133s. During the same time period $T_8$, which serves to forward one-half of the charge ($Q_R/2$) to that one of the signal sensing channels 95 and 97 whose charge contents were sensed to be the lesser, the comparator latch 151 is again prepared by application of the $Q_{ST}$ pulse 182-1 to perform its next bit charge sensing function. Consequently, at the instant $t_8$, marking the end of the $\phi_{DIV}$ and $\phi_{ST}$ pulses 180-1 and 182-1, the charges previously under the electrodes 133r and 133s are shifted forward, or downstream, under the sensing electrodes 135 and 137, causing those electrodes to assume new potential levels reflecting the relative magnitudes of the charges under them (see FIG. 8e). If it were assumed, for example that the total of the charges $Q_S+Q_R/4$ exceeds the charge $Q_R/2$, the resulting voltages on the sensing electrodes 135 and 137 would result in returning the flip-flop 153 to its original condition in which a logic "1" appears on its Q output and a logic "0" on its $\overline{Q}$ output. Consequently, when the charge $Q_R4$ is again sloshed forward through the inlets 101 and 103, one-half of it, or $Q_R/8$, would be held captive under the electrode 123i and the other half of it would be shifted forward through the inlet 103 to be added to the reference charge $Q_R/2$ residing under the electrode 133r.

The process just described is repeated a predetermined number of times, the number depending upon the desired precision of the digital number to be generated. Assuming, for example, that an 8-bit number is to be generated, the process would be terminated after eight cycles of the above described operation by applying a second $\phi_{RST}$ pulse 178-1 to the flip-flop 153 input 176.

A number of modifications, none of which departs from the present invention, will readily occur to those skilled in the art. For example, the clocking scheme can be changed in order to reduce the number of steps in the potential gradient, lessening the criticality of the clocking voltage magnitudes. Secondly, the reference and signal channels 91 and 93 need not be parallel. They may oppose one another. Referring to FIG. 7, this can be accomplished by moving the signal channel 91 from the left side of the reference channel 93 to a position opposite that of the channel, so that the signal charge $Q_S$ flows from the bottom of FIG. 7 toward its top, with $Q_S$ and $Q_R$ converging toward the sensing station between them. Furthermore, the floating electrodes 135 and 137 used for sensing the charges in the sensing stations 95 and 97 could be replaced by floating diffusions in which the charges to be compared are stored. Moreover, the capability of the device of FIG. 7 could be expanded by a further modification to enable it not only to generate a binary number representative of a single analog signal, but to also generate such a number which represents the difference between two analog signals. This could be achieved by adding a second signal channel to the right of the reference channel 93 and resetting both of the Q and $\overline{Q}$ electrodes 127 and 129 to the off condition initially. With this modified embodiment, the first bit would always encode the sign of the difference between the two analog signals and the remainder of the conversion would yield the binary codes for the amplitude of the difference between them.

All of the aove mentioned possible modifications are incorporated in a second preferred embodiment depicted in FIGS. 11, 12, 13a and 13b.

The modified device of FIG. 11 is formed in a P conductivity type substrate 186 in which a reference channel 189 and two signal channels 191 and 193 are defined by means of a rectangularly configured channel stopping region 187, from the right end of which there extends a partition region 187-1. Basically, a reference charge $Q_R$ is injected into the reference channel 189 through an input diffusion 195 located at the left end of the device and this charge propagates toward the partition 187-1 which eventually causes it to split into two charge packets, each of them containing half of the charge $Q_R$. Two quantities of charge, which will eventually serve to represent the two signals to be compared, are injected into the upper and lower signal channels 191 and 193 through input diffusions 197 and 199. As these charges pass from the diffusions 197 and 199 toward the left of the device in the upper and lower channels 191 and 193, they are measured into two charge quantities $Q_{S1}$ and $Q_{S2}$, which represent the signals to be compared. The measured signal charges $Q_{S1}$ and $Q_{S2}$ continue toward the left of the device in their respective channels 191 and 193 until they reach a pair of floating diffusions 201 and 203 whose function corresponds to those of the floating electrodes 135 and 137 of FIG. 7.

The progressive transfer of the signal charges $Q_{S1}$ and $Q_{S2}$ is accomplished by a series of electrodes 205, 207, 213, 215 and 217, which span both of the signal channels 191 and 193. The measuring of the charge injected through the input diffusions 197 and 199 is achieved by applying the signal voltages to a pair of signal electrodes 209 and 211 which individually span a respective one of the channels 191 and 193.

In a similar manner, transfer of the reference charge $Q_R$ from the input diffusion 195 toward the central partition 187-1 is achieved by a series of electrodes 219, 221, 223, 225, 227, 229 and 231, all of which span the entire reference channel 189, with the last two named electrodes extending over the partition 187-1. In this regard it will be observed that, the reference channel 189 is bifurcated at its right end into upper and lower channel portions 189-1 and 189-2. Extending over the respective upper and lower reference channel portions 189-1 and 189-2 are individual gating electrodes 233 and 235 whose function corresponds to those of the gating electrodes 127 and 129 of FIG. 7. An additional electrode 237, disposed between the gating electrodes 189-1 and 189-2 on the one hand and the sensing diffusions 201 and 203 on the other hand serves to establish an appropriate potential level in the substrate surface for transferring charges gated through a selected one of the two gating electrodes to the diffusions.

Each of the floating diffusions 201 and 203 is connected to one of the output circuits 243 and 245 illustrated in FIGS. 13a and 13b. Since the two output circuits are identical, only that illustrated in FIG. 13a will be described. It includes a field-effect transistor (FET) having a source 247 and a drain 249, both N+ type diffusions, in the substrate 186, but outside the confines of the channel stopper region 187. A pair of gates 251 and 253 are disposed between source and drain regions 247 and 249, the gate 253 being pulsed from a source $\theta RST$ in order to reset the FET and the other gate 251 being biased from a source $V_{SCR2}$ in order to isolate the source 247 from the pulses being applied to the gate 253. The source 247 serves as the input diffusion to the FET and is connected to the output terminal 239 of the diffusion 201.

The source 247 is connected to the gate of one of a pair of series connected MOSFETS 255 and 257, which together serve as a source follower output amplifier. The gate of the other MOSFET 257 is biased into conduction from a source $V_{G4}$. The two MOSFETS 255 and 257 are connected in series between a potential source $V_{DDA}$ and ground, the two transistors being joined at a point 259 which serves as the output of the circuit 243. The voltage on the output node 259 varies in proportion to the voltage on the source 247, thus reflecting the magnitude of the charge stored under the floating diffusion 201. The circuit is reset by the application of a $\phi_{RST}$ pulse to the gate 253 which causes the source 247 to be pulled to the $V_{DD}$ potential being applied to the drain 249.

The respective outputs of the circuits 243 and 245 may be applied to a control circuit such as that illustrated in FIG. 9, with the Q and $\overline{Q}$ outputs of that circuit being connected to the Q and $\overline{Q}$ terminals of the gating electrodes 233 and 235, respectively.

In general, the conversion process executed by the device of FIGS. 11-14 begins with the stepping of a pair of charges $Q_{S1}$ and $Q_{S2}$ to the sensing diffusions 201 and 203, with the split reference charges $Q_R/2$ being prevented from reaching those diffusions by blocking potentials initially applied to both of the gating electrodes 233 and 235. The relative magnitude of those charges will be reflected by the relative magnitudes of the voltages produced by the output circuit 243 and 245, and these voltages in turn will cause one or the other of the gating electrodes 233 and 235 to permit one of the split reference charges $Q_R/2$ to enter one of the sensing diffusions 201 and 203 during the following comparison cycle. The first operation just described will determine the sign of the difference of the two signals being compared. During successive cycles the reference charge just upstream from the partition 187-1 will be progressively divided in half, with one-half being transferred downstream to be added to the lesser of the charges in the two diffusions 201 and 203 and with the other charge being sloshed back upstream again for a subsequent division in a manner similar to that described previously with reference to FIG. 7.

Figure 14:
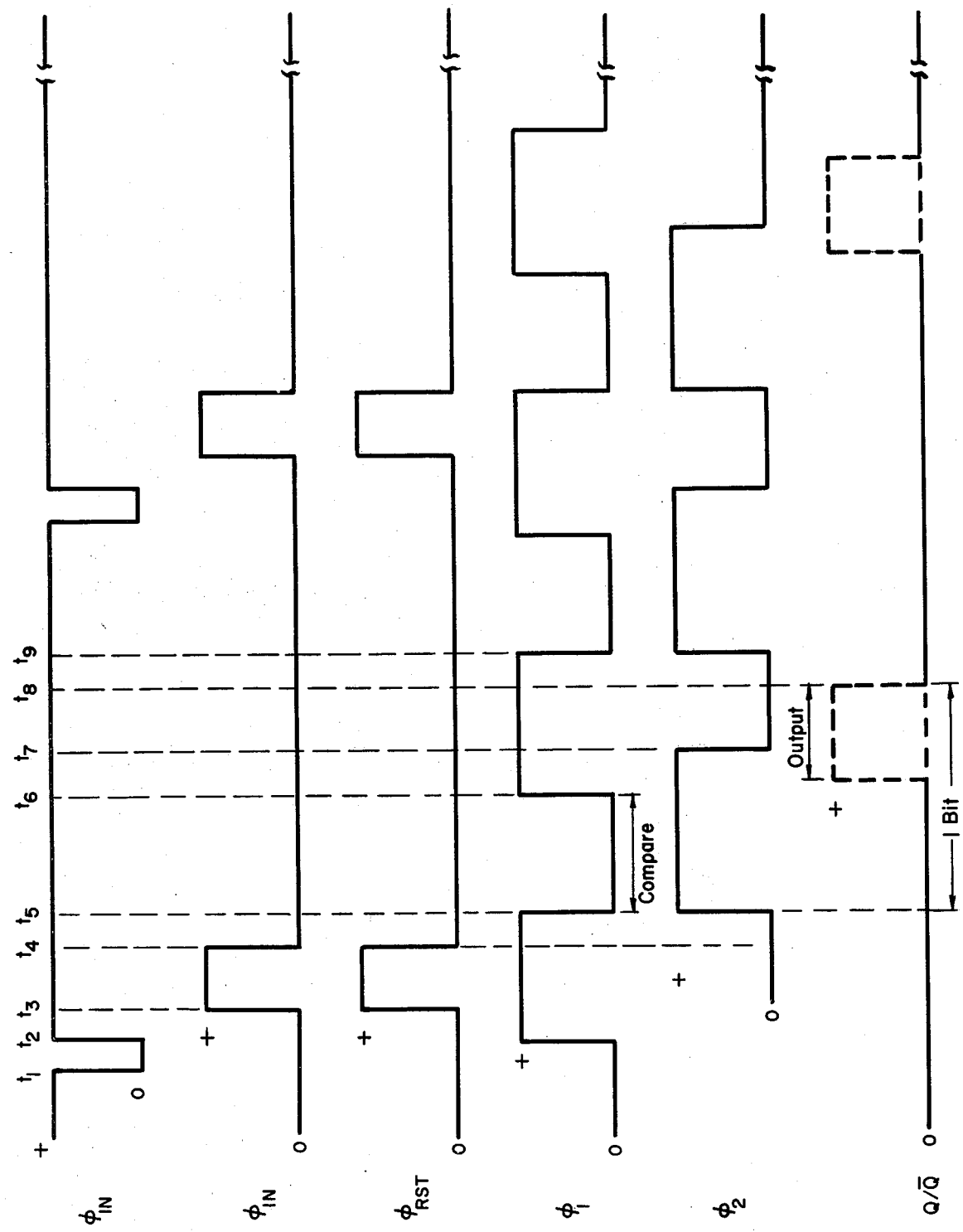
FIG. 14 is a timing diagram of clock pulses used to operate the CCD A/D converter illustrated in FIGS. 11-13.

In greater detail, and with additional reference to the timing diagram of FIG. 14, the converter of FIGS. 11-13 operates in the following manner. At time $t_1$ a charge is injected through each of the input diffusions 191, 193 and 195, by application of $\theta_{IN}$ pulse thereto. Charges proportional to the potentials applied to the REF, SIG A and SIG B electrodes 223, 209 and 211 will reside under those electrodes. At time $t_2$ $\phi_1$ goes high, creating a potential well 261 under electrodes 227 and 215 and shortly thereafter, at time $t_3$, $\theta_1$ goes high, creating slightly shallower potential wells 263 under electrodes 225 and 213. As a result, at time $t_3$ the charges under the REF and SIG electrodes 223, 209 and 211 move to the potential wells 261, 263 under the $\theta_1$ electrodes 225, 227 in the reference channel 189, and electrodes 213, 215 in signal channels 191 and 193. Also at time $t_3$ $\theta_{RST}$ goes high, turning on the MOSFETS of both of the output circuits 243 and 245 and resetting the control circuit of FIG. 9.

At time $t_4$, $\theta_1$ goes down, raising the potential level under electrodes 225 and 213, causing all of the charge to be confined in the potential wells 261 under the $\phi_1$ electrodes 225 and 213. At $t_5$, $\theta_1$ goes down, raising the potential well 261 under electrodes 227 and 215, causing the charge to spill past the barrier under $V_{DIV}$ electrode 229 into the potential wells 265 under $\phi_2$ electrode 231, which are created at the same time $t_5$ by $\phi_2$ going low. During this initial cycle both of the Q electrodes 233 and 235 are clamped to a low voltage so that there is a charge barrier 267 under each of them. The shifting forward of the charge $Q_R$ past the $V_{DIV}$ electrode 229 and under the $\phi_2$ electrode 231 causes it to split, since it now moves past the central stopping partition 187-1.

Also beginning at time $t_5$ the signal charges $Q_{S1}$ and $Q_{S2}$ previously under $\theta_1$ electrode 215 will be dumped from under that electrode past the $V_{SCR1}$ electrode 217 in the signal channels 191 and 193 and into the floating diffusions 201 and 203. This begins the first comparison, which does not involve the reference charge but only the two signal charges $Q_{S1}$ and $Q_{S2}$. At this time, the Q and $\overline{Q}$ electrodes 233 and 235 are unclamped and ready to accept the result of this comparison which is fed back through the detecting circuits of FIG. 9 to the Q and $\overline{Q}$ electrodes 233 and 235, causing the potential of one to go up and that of the other to go down at time $t_6$. This yields the sign of the difference between $Q_{S1}$ and $Q_{S2}$.

Also at time $t_6$ $\phi_1$ goes high and, shortly thereafter, at time $t_7$ $\phi_2$ goes low. Up to this time the two halved reference charges $Q_R/2$ had resided under the two portions of the $\phi_2$ electrode 231. As a result of the reversal in the states of $\phi_1$ and $\phi_2$, at time $t_7$ one of the reference charges $Q_R/2$ is back under the $\theta_1$ electrode 227 and the other is transferred to that one of the Q electrodes 233 and 235 under which a potential well has been established, which will depend upon the result of the previous comparison. At time $t_8$ both of the Q and $\overline{Q}$ electrodes 233 and 235 are clamped back to zero, raising the potentials under them so that there is no potential well under either and so that the other $Q_R/2$ charge residing under one of them is transferred past the $V_{SCR1}$ electrode 237 into one of the two diffusions 201 and 203.

At time $t_9$ $\phi_1$ goes low and $\phi_2$ goes high, recreating the potential well 265 under the electrode 231. As a result, the charge previously stored under the $\phi_1$ electrode 227 is sloshed forward past the $V_{DIV}$ electrode 229 and under the two portions of the $\phi_2$ electrode 231 so that the charge $Q_R/2$ is again divided in two. This marks the beginning of the next cycle of the digital conversion process, during which one of the reference charges resulting from the division of $Q_R/2$ is added to that one of the diffusions 201 and 203 whose stored charge was sensed to be the lesser during the preceding operating cycle.

Figure 12:
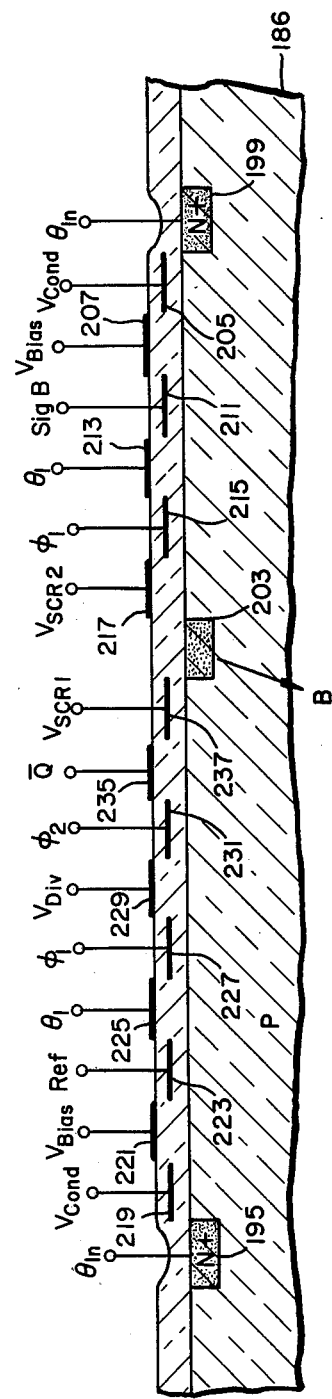
FIG. 12 is a simplified schematic diagram similar to FIG. 8a, illustrating the vertical disposition of electrodes along the line 12—12 of FIG. 11
Figure 12A:
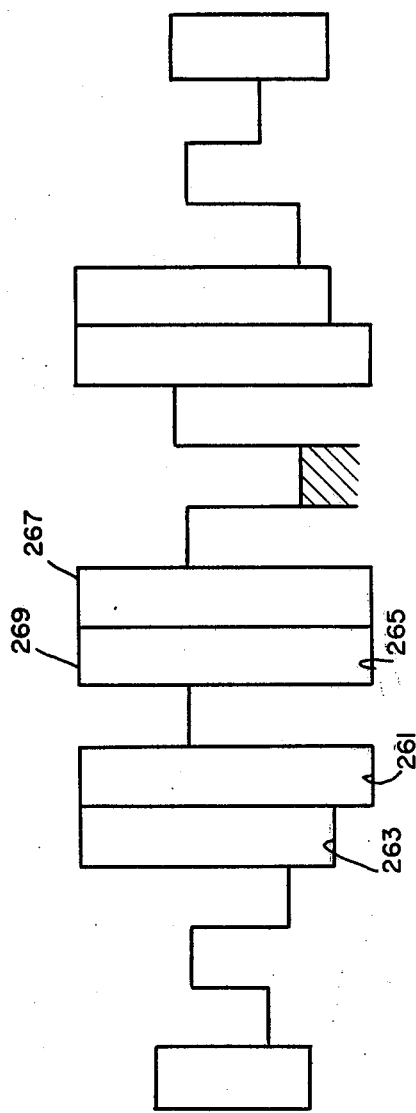
FIG. 12a illustrates the potential gradients prevailing under those electrodes.

It should be understood that the several modifications which are incorporated in the system of FIGS. 11–13 need not all be made. For example, the system of FIGS. 11–13 could be made by using floating electrodes for sensing the charges rather than floating diffusions. Similarly, the system of FIGS. 11–13 need not necessarily incorporate two signal input channels. Instead, it could be used, in the manner of the FIG. 7 system, to digitize a single analog signal by omitting the bottom signal input and sensing channel 211 and its associated diffusions 199 and 203.

We claim:

1. A charge coupled analog-to-digital converter, wherein a reference charge is repeatedly halved, and the halved reference charge is progressively added either to a signal charge which is to be digitized or to a previously accumulated fraction of the reference charge in accordance with a successive approximation algorithm, said converter comprising in combination:
   (a) a semiconductor charge storage medium;
   (b) an insulating layer covering at least one surface of said medium;
   (c) means, forming a barrier to the flow of charge, for defining in said medium a signal input channel, a reference input channel, a signal sensing channel, and a reference sensing channel, said signal input channel opening into said signal sensing channel and said reference input channel opening into both said signal sensing and reference sensing channels through equally sized inlets;
   (d) a plurality of electrodes supported over said channels by said insulating layer;
   (e) input means, including a first source of control voltages and certain of said plurality of electrodes spaced from said sensing channels, for individually injecting and storing in respective ones of said signal and reference input channels, signal and reference charges;
   (f) means, including certain of said plurality of electrodes, and also including a second cource of control voltages, for shifting said signal charge from said signal channel to said signal sensing channel and holding said charge there;
   (g) dividing means for shifting during each of a series of periodically recurring time periods, half of the charge stored in said reference input channel into a selected one of said signal and reference sensing channels, said dividing means including
      (1) one of said electrodes disposed over each of said equally sized inlets, and
      (2) a third source of control voltages for applying potentials to the electrodes disposed over said inlets so as to block the flow of charge through one of said inlets while causing charge to flow through the other of said inlets, said third source of control voltage being operative first to create a potential well under the electrode which extends over the blocked one of said inlets so as to cause half of the charge in said reference channel to be captured in said potential well while permitting the other half of said charge to flow through the other one of said inlets and then to create a potential gradient causing said captured half of said charge to return to said reference channel;
   (h) means, including a pair of additional electrodes supported over said medium by said insulating layer, for sensing the relative magnitude of the charges stored in said signal and reference sensing channels after each of said recurring timer periods; and
   (i) control means coupled between said sensing means and selected ones of the electrodes forming said dividing means for causing said dividing means to shift charge to said selected one of said signal and reference sensing channels after each of said recurring time periods in response to the relative charge magnitudes sensed by said sensing means so that it is always the lesser of the compared charges that is increased, said control means having two output states, each occurring when a respective one of the sensed charges is greater, said two output states respectively representing a binary "1" and a binary "0" for a given bit of a multi-bit number, whereby, after each of said periodically recurring time periods, said control means assumes a state signalling the binary value of a successive bit in a multi-bit binary number generated by successive approximation.

2. The combination of claim 1 wherein said control means includes a bistable latch operative to assume a respective one of its two stable states in response to a respective one of said charge magnitudes sensed by said sensing means being larger than the other of said charge magnitudes.

3. The combination of claim 1 wherein said signal channel and said reference channel are side by side.

4. The combination of claim 1 wherein said signal channel and said reference channel face one another, with the sensing channel being disposed between them.

* * * * *